United States Patent [19]
Ristic

[11] Patent Number: 5,179,429
[45] Date of Patent: Jan. 12, 1993

[54] MAGNETIC FIELD SENSOR WITH SPLIT COLLECTOR CONTACTS FOR HIGH SENSITIVITY

[75] Inventor: Ljubisa Ristic, Paradise Valley, Ariz.

[73] Assignee: Motorola, Inc., Schaumburg, Ill.

[21] Appl. No.: 860,395

[22] Filed: Mar. 30, 1992

[51] Int. Cl.⁵ .......................................... H01L 27/22
[52] U.S. Cl. ................................ 257/414; 324/252;
257/421; 257/422; 257/423; 257/427
[58] Field of Search ..................... 357/27, 25, 34, 35;
324/252

[56] References Cited

U.S. PATENT DOCUMENTS

| | | | |
|---|---|---|---|
| 4,607,271 | 8/1986 | Popovic et al. | 357/27 |
| 4,987,467 | 1/1991 | Popovic | 357/27 |
| 4,999,692 | 3/1991 | Ristic et al. | 357/27 |
| 5,099,298 | 3/1992 | Nakamura et al. | 357/27 |

Primary Examiner—William Mintel
Attorney, Agent, or Firm—Robert D. Atkins

[57] ABSTRACT

A magnetic field sensor is provided by a lateral bipolar transistor having a base region formed of a first conductivity type, an emitter region formed of a second conductivity type disposed in the base region for emitting charge carriers, and a collector region of the second conductivity type disposed in the base region for receiving charge carriers from the emitter region. A first and second metallic contact are connected to the collector region for splitting the collector current into first and second collector contact currents. In the presence of a magnetic field, a number of the charge carriers are deflected toward the first or the second metallic contact, depending on the orientation of the magnetic field, causing an imbalance in the first and second collector contact currents. The noise at the metallic contacts is the same as the noise of a single collector transistor which effectively correlates the noise with itself and cancels any distortion associated with the noise.

8 Claims, 2 Drawing Sheets

MAGNETIC FIELD SENSOR WITH SPLIT COLLECTOR CONTACTS FOR HIGH SENSITIVITY

BACKGROUND OF THE INVENTION

The present invention relates in general to magnetic field sensors and, more particularly, to a magnetic field sensor with split collector contacts for high sensitivity operation.

Magnetic field sensors are commonly used to detect the presence and orientation of a magnetic field. A magnetic field sensor may be formed in a semiconductor material, for example, as two lateral NPN bipolar transistors with separate collector regions, and a common base region, and a common emitter region, otherwise known as a magnetotransistor.

The principal of operation follows the Lorentz Force action on the movement of charge carriers (electrons for NPN transistors) in the semiconductor material. The Lorentz Force action on electrons is described by the equation $\bar{F} = -e\bar{v} \times \bar{B}$, and for holes by $\bar{F} = e\bar{v} \times \bar{B}$, where "e" is the electron charge, $\bar{v}$ is the velocity vector of the carriers, $\bar{B}$ is the magnetic induction vector, and $\bar{F}$ is the deflection force vector operating on the charge carriers due to the magnetic field. The bipolar transistors are biased in their forward active region of operation. In the absence of a magnetic field, a bias potential applied at the common base causes equal currents to flow through the collectors of the two lateral NPN transistors due to their symmetrical construction. When the magnetic field is applied parallel to the surface of the devices, the carriers deflect toward one collector according to the orientation of the magnetic field, thereby creating an imbalance between the collector currents of the bipolar transistors. The collector current imbalance is used to determine the strength and orientation of the magnetic field.

The separate collector regions of the bipolar transistors are susceptible to noise in the same way as the collector of a single bipolar transistor. Furthermore, the noise of the differential lateral transistors is higher than the noise of a single collector lateral transistor because the signals of the two separate collectors are not correlated. The noise presence limits the sensitivity of the magnetotransistor to the magnetic field. Therefore, a need exists for a magnetic field sensor with reduced effect from the noise for higher sensitivity.

SUMMARY OF THE INVENTION

Briefly stated, the invention comprises a magnetic field sensor including a lateral bipolar transistor having a base region receiving a bias voltage, and an emitter region receiving a potential for emitting charge carriers in a path toward a collector region for conducting a collector current. A first and second metallic contact are coupled to the collector region for splitting the collector current into first and second collector contact currents which become imbalanced in a magnetic field.

In another aspect, the present invention is a method of sensing orientation and strength of a magnetic field in a semiconductor material comprising the steps of forming a base region of a first conductivity type, disposing an emitter region of a second conductivity type in the base region for emitting charge carriers, disposing a collector region of the second conductivity type in the base region for receiving charge carriers from the emitter region for conducting a collector current, connecting first and second metallic contacts to the collector region for splitting said collector current into first and second collector contact currents, and applying a magnetic field oriented in a first direction to deflect a number of the charge carriers toward the first metallic contact causing an imbalance in the first and second collector contact currents.

DETAILED DESCRIPTION OF THE PRIOR ART

Figure 1:
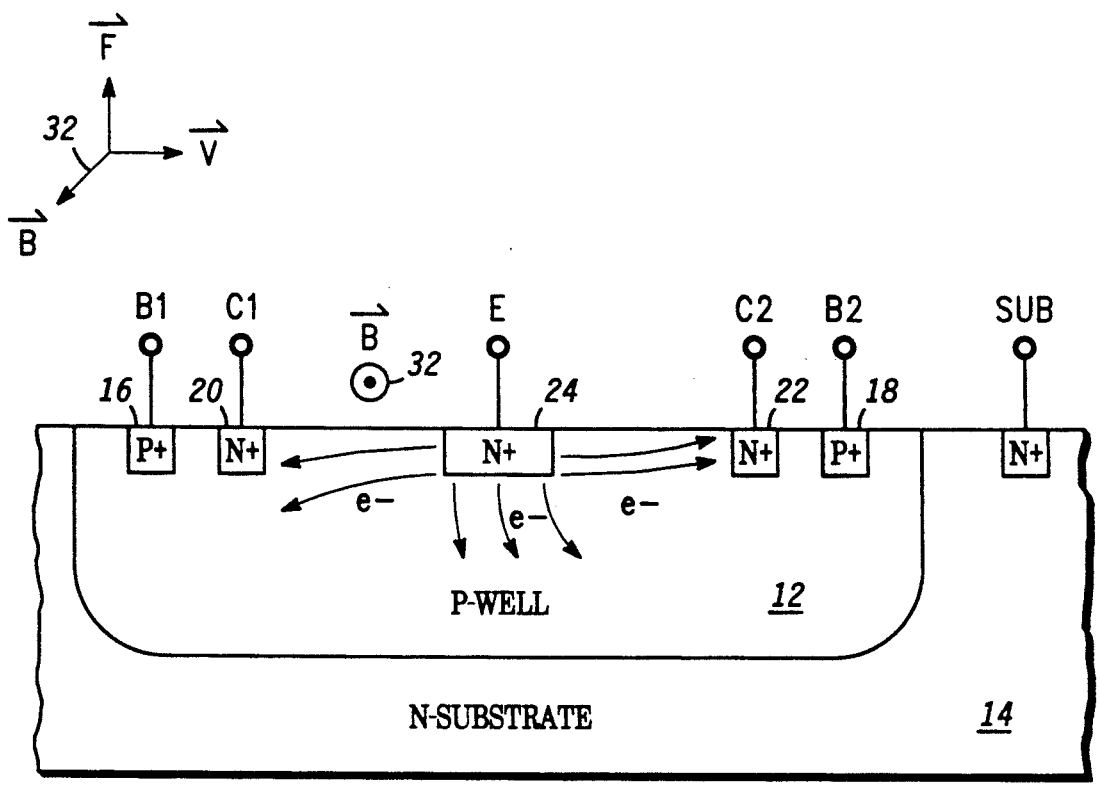
FIG. 1 illustrates a cross section of a prior art magnetic field sensor based on a bipolar transistor.

A conventional magnetic field sensor 10 is shown in FIG. 1 as a cross section of two lateral bipolar NPN transistors. A P-well base region 12 of P-type semiconductor material is disposed in N-substrate region 14 which is composed of N-type semiconductor material. P+-regions 16 and 18 provide for the base contacts $B_1$ and $B_2$, respectively. N+-regions 20 and 22 form first and second collector regions composed of N-type semiconductor material. Since N+-regions 20 and 22 are physically separate collector regions, they are also independent and the collector currents are uncorrelated. Collector contact $C_1$ is coupled to N+-region 20, and collector contact $C_2$ is coupled to N+-region 22. N+-region 24 forms an emitter with N-type semiconductor material. The emitter contact E is coupled to N+-region 24.

Figure 2:
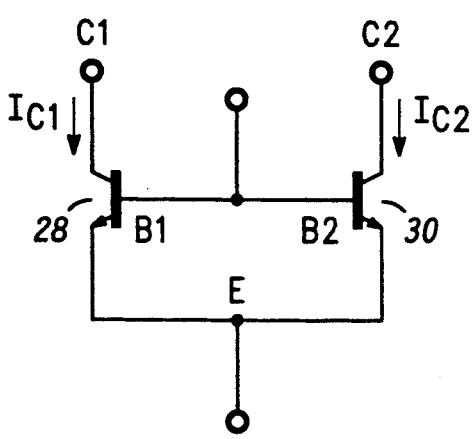
FIG. 2 is a schematic diagram illustrating the prior art magnetic field sensor of FIG. 1.

The lateral NPN transistor arrangement of FIG. 1 is schematically illustrated in FIG. 2. The collector contacts $C_1$ and $C_2$ provide separate electrodes for transistors 28 and 30, respectively, while the base contacts $B_1$ and $B_2$ are shown connected together because of the common P-well base region 12. The emitter of transistors 28 and 30 are connected together due to the single N+-region 24 shown in FIG. 1.

When the base-emitter junction is forward biased, N+-region 24 emits minority carriers (electrons). Without the influence of a magnetic field, the electron emission is uniform whereby N+-regions 20 and 22 collect substantially equivalent number of electrons and thus conduct equal collector currents. When the magnetic field $\bar{B}$ 32 is applied with an orientation normal to the drawing (coming out of the page) in FIG. 1, the Lorentz Force action cause an upward deflection of the elections flowing between N+-region 24 and N+-region 22. The elections flowing between N+-region 24 and N+-region 20 are deflected downward. Thus, N+-region 22 collects a number of electrons otherwise destined for N-substrate 14 which increases the collector current flow through collector contact $C_2$. N+-region 20 collects fewer electrons because a number are deflected away into N-substrate 14. Collector current flow decreases in collector contact $C_1$. The collector currents flowing through collector contacts $C_1$ and $C_2$ thus operate differentially.

One of the problems with the magnetic field sensor shown in FIG. 1 is its susceptibility to noise which comes from a variety of sources including the base, the collector-base junction, and the emitter. The collector currents from N+-regions 20 and 22 are uncorrelated because of their independent physical construction. The effect of the noise of the differential collector currents from the two collector regions is higher than the noise effect on a single collector transistor. This masks the imbalance in the collector currents attributed to the magnetic field. The sensitivity of the magnetic field sensor could be improved by reducing the effect of noise differences on the differential collector currents.

DETAILED DESCRIPTION OF THE PREFERRED EMBODIMENT

Figure 3:
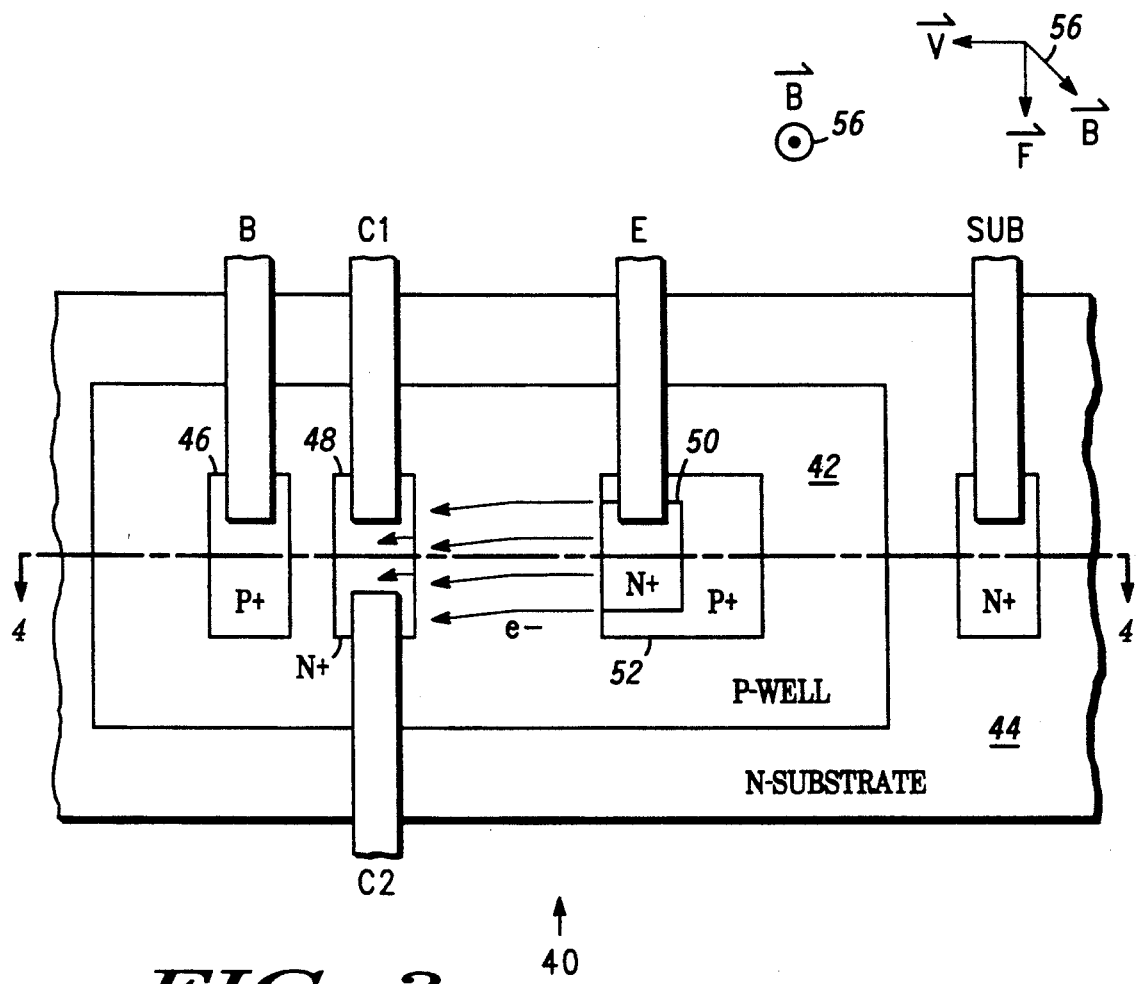
FIG. 3 illustrates a top view a magnetic field sensor with split collector contacts.
Figure 4:
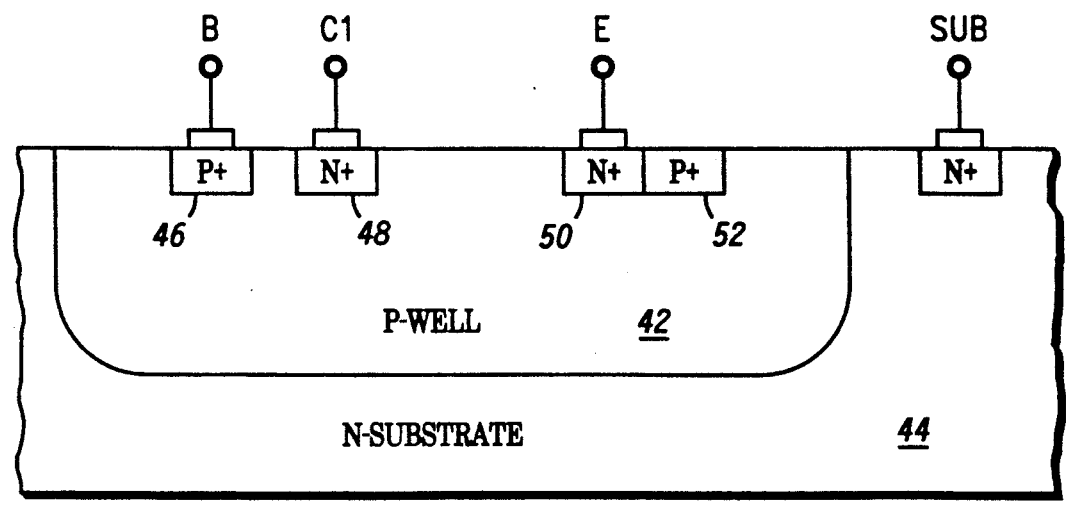
FIG. 4 is a cross section of the magnetic field sensor of FIG. 3.

A magnetic field sensor 40 is shown in FIG. 3 as a top view of a single lateral NPN transistor with split collector contacts. FIG. 4 is a cross sectional view of the same lateral NPN transistor. A P-well base region 42 of P-type semiconductor material is disposed in N-substrate region 44 which is composed of N-type semiconductor material. N-substrate 44 may be connected to a positive power supply potential Vcc via contact SUB. P+-region 46 provides for the base contact B, and N+-region 48 forms a collector region composed of N-type semiconductor material. N+-region 48 is coupled to collector metallic contacts $C_1$ and $C_2$. Preferably, collector contacts $C_1$ and $C_2$ should be positioned at opposite ends of N+-region 48 as shown in FIG. 3. N+-region 50 forms an emitter with N-type semiconductor material surrounded on three sides by P+-region 52 for directional control to confine electron emission toward N+-region 48. Emitter contact E is coupled to N+-region 50.

Figure 5:
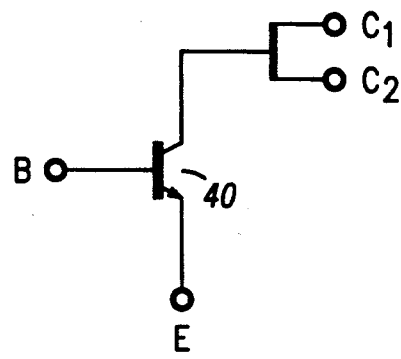
FIG. 5 is a schematic diagram illustrating the magnetic field sensor of FIG. 3.

The lateral NPN transistor arrangement of FIG. 3 is schematically illustrated in FIG. 5. A bias potential is applied to base contact B, while emitter contact E receives ground potential. The collector contacts $C_1$ and $C_2$ from transistors 54 are shown as split metallic contacts from a single collector region. That is, collector contacts $C_1$ and $C_2$ are two metal lines taken from N+-region 48.

When the base-emitter junction is forward biased by the bias potential, N+-region 24 emits minority carriers (electrons). Without the influence of a magnetic field, the electron emission is uniform and N+-region 48 evenly collects electrons. The collector current flowing through contact $C_1$ is equal to the collector current flowing through contact $C_2$. When the magnetic field $\vec{B}$ 56 is applied with an orientation normal to the drawing (coming out of the page) in FIG. 3, the Lorentz Force action causes a downward deflection of the elections flowing between N+-region 50 and N+-region 48 toward collector contact $C_2$ (see FIG. 3). Thus, N+-region 48 collects more electrons in the vicinity of collector contact $C_2$ than collector contact $C_1$. Collector current flow increases in collector contact $C_2$ and decreases in collector contact $C_1$. Alternately, when the magnetic field $\vec{B}$ 56 is applied with an orientation going down into the page, the Lorentz Force action causes a upward deflection of the elections (not shown) flowing between N+-region 50 and N+-region 48 toward collector contact $C_1$. Thus, N+-region 48 collects more electrons in the vicinity of collector contact $C_1$ than collector contact $C_2$. Collector current flow increases in collector contact $C_1$ and decreases in collector contact $C_2$ in a differential manner.

A key feature of the present invention is the single N+-region 48 with split collector contacts $C_1$ and $C_2$. When electrons reach N+-region 48, all possible sources of noise, i.e., emitter, base, collector-base junction, have already effected the charge carriers. Splitting the electrons between $C_1$ and $C_2$ at N+-region 48 correlates the noise with itself and cancels any distortion associated with the noise. The imbalance in the collector currents is attributed only to the strength of the magnetic field. The sensitivity of the magnetic field sensor is thus improved by reducing the effect of the noise on the collector currents.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A magnetic field sensor, comprising:
   a lateral bipolar transistor having a base region, an emitter region and a collector region, said base region receiving a bias voltage, said emitter region receiving a potential for emitting charge carriers in a path toward said collector region for conducting a collector current; and
   first and second metallic contacts coupled to said collector region for splitting said collector current into first and second collector contact currents which become imbalanced in a magnetic field.

2. The magnetic field sensor of claim 1 wherein a magnetic field oriented in a first direction deflects a number of said charge carriers toward said first metallic contact causing an imbalance in said first and second collector contact currents such that said first collector contact current is greater than said second collector contact current.

3. The magnetic field sensor of claim 2 wherein said magnetic field oriented in a second direction deflects a number of said charge carriers toward said second metallic contact causing an imbalance in said first and second collector contact currents such that said second collector contact current is greater than said first collector contact current.

4. The magnetic field sensor of claim 1 wherein said first and second metallic contacts are positioned at opposite ends of said collector region.

5. A magnetic field sensor, comprising:
   a transistor having a base region formed of a first conductivity type, an emitter region formed of a second conductivity type disposed in said base region and a collector region formed of said second conductivity type disposed in said base region, said base region receiving a bias voltage, said emitter region receiving a power supply potential for emitting charge carriers in a path toward said collector region for conducting a collector current; and
   first and second metallic contacts coupled to said collector region for splitting said collector current into first and second collector contact currents, said first and second collector contact currents becoming imbalanced in a magnetic field.

6. The magnetic field sensor of claim 5 wherein a magnetic field oriented in a first direction deflects a number of said charge carriers toward said first metallic contact causing an imbalance in said first and second collector contact currents such that said first collector contact current is greater than said second collector contact current.

7. The magnetic field sensor of claim 6 wherein said magnetic field oriented in a second direction deflects a number of said charge carriers toward said second metallic contact causing an imbalance in said first and second collector contact currents such that said second collector contact current is greater than said first collector contact current.

8. The magnetic field sensor of claim 5 wherein said first and second metallic contacts are positioned at opposite ends of said collector region.

* * * * *